(12) United States Patent
Nyberg

(10) Patent No.: US 7,157,988 B2
(45) Date of Patent: Jan. 2, 2007

(54) VOLTAGE CONTROLLED RESISTOR AND A CONTROLLING METHOD

(75) Inventor: Petri Nyberg, Helsinki (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/485,977

(22) PCT Filed: Aug. 12, 2002

(86) PCT No.: PCT/FI02/00662

§ 371 (c)(1),
(2), (4) Date: Mar. 10, 2004

(87) PCT Pub. No.: WO03/021777

PCT Pub. Date: Mar. 13, 2003

(65) Prior Publication Data

US 2004/0239440 A1  Dec. 2, 2004

(30) Foreign Application Priority Data

Aug. 13, 2001 (FI) .................................. 20011634

(51) Int. Cl.
*H01P 1/22* (2006.01)
(52) U.S. Cl. .................................... 333/81 R; 327/308

(58) Field of Classification Search .............. 333/81 R; 327/308

See application file for complete search history.

(56) References Cited

U.S. PATENT DOCUMENTS

| | | | |
|---|---|---|---|
| 5,006,735 A * | 4/1991 | Taylor | 327/308 |
| 5,049,841 A | 9/1991 | Cooper et al. | 333/81 R |
| 5,309,048 A | 5/1994 | Khabbaz | 327/306 |
| 2002/0186066 A1* | 12/2002 | Soda | 327/308 |

FOREIGN PATENT DOCUMENTS

| | | |
|---|---|---|
| JP | 64-030315 | 2/1987 |
| JP | 01-143515 | 6/1989 |
| JP | 07-079132 | 3/1995 |

* cited by examiner

*Primary Examiner*—Stephen E. Jones
(74) *Attorney, Agent, or Firm*—Cohen, Pontani, Lieberman & Pavane (57) ABSTRACT

The invention discloses a new and original voltage variable resistor VVR with input and output ports and a first input and second input for control signals to set the impedance between the input and output ports as desired over a certain range and, thus, to optimize the operation of the VVR from the transmitter device control viewpoint as regards both the linearity and minimum impedance. The invention further discloses a method for controlling a VVR and a cellular radio system terminal.

20 Claims, 6 Drawing Sheets

VOLTAGE CONTROLLED RESISTOR AND A CONTROLLING METHOD

PRIORITY CLAIM

This is a national stage of PCT application No. PCT/FI02/00662, filed on Aug. 12, 2002. Priority is claimed on that application and on application No. 20011634 filed in Finland on Aug. 13, 2001.

BACKGROUND OF THE INVENTION

The invention relates in general to electronics technology in wireless communications and in particular to the control of transmission power as specified in the preamble of the first claim.

Optimization of transmission power is important in a portable terminal, for example, because if the transmission power is too low, it may cause annoying breaks in the connection or the connection may be lost altogether. If, on the other hand, the transmission power is too high, it may interfere with nearby devices and unnecessarily drain the power source of the portable device.

Electronic components are known in which the resistance depends on the voltage between input and output. There are also components in which the resistance between the input and output can be varied by means of a control signal additionally coupled to the component. Such components will be hereinafter called voltage variable resistors (VVR). Typically, VVRs are used e.g. in voltage variable attenuators (VVA) employed in radio device transmitters.

Figure 1:
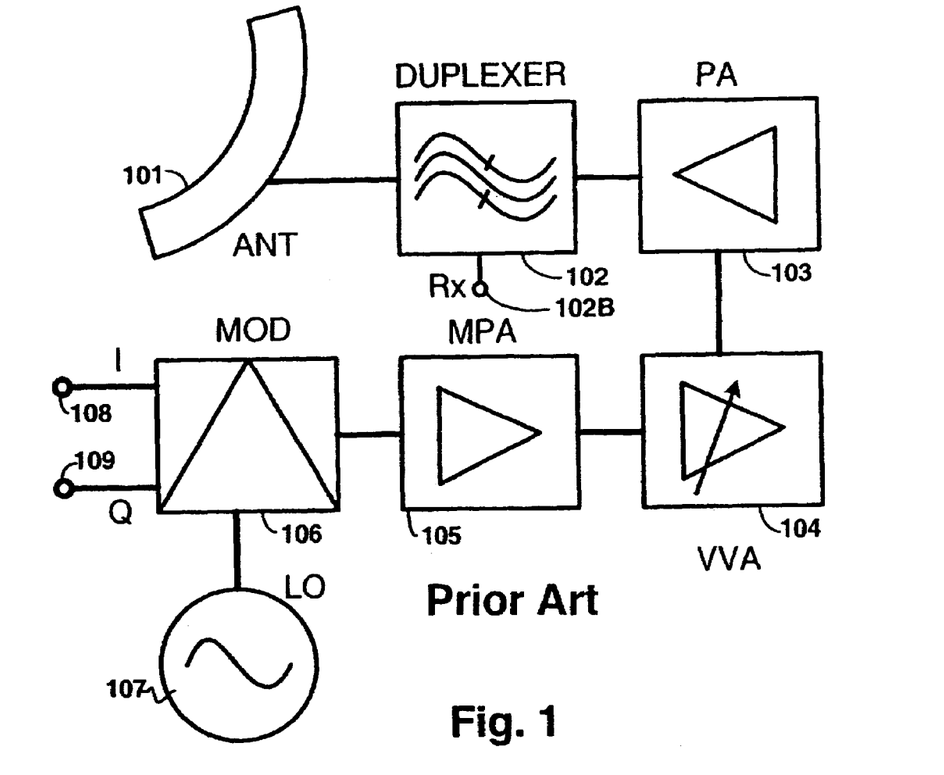
FIG. 1 shows a typical known direct-conversion-type radio transmitter.

FIG. 1 shows a diagram illustrating the use of a VVA in a RF transmitter with a typical direct-conversion-type transmitter arrangement. In the arrangement there is a modulator MOD 106 with input pins I 108 and Q 109 for incoming signals, an oscillator LO 107, amplifier MPA 105, voltage variable attenuator VVA 104, a second amplifier PA 103, band-pass filter DUPLEXER 102, shown with a receive branch output Rx 102B, and an antenna ANT 101.

The arrangement of FIG. 1 includes a VVA 104 to control the transmission power of the TX chain depicted. Linearity of the transmitter VVA dictates the level of amplification needed in the TX chain following the VVA. There is also a relationship between linearity and power handling capacity such that more linear VVAs can handle more power. Therefore, less post-VVA amplification is needed. Post-VVA amplification, in turn, influences the broadband noise minimum level at the transmitter, which is significant regarding, among other things, the output power dynamic range at the transmitter and TX-RX isolation requirements in the duplex filter.

A VVR can be implemented using semiconductors, for example. A conventional FET can be set to its operating point in such a manner that the drain-source resistance can be varied by the gate voltage whereby the FET can be used as VVR.

Figure 2:
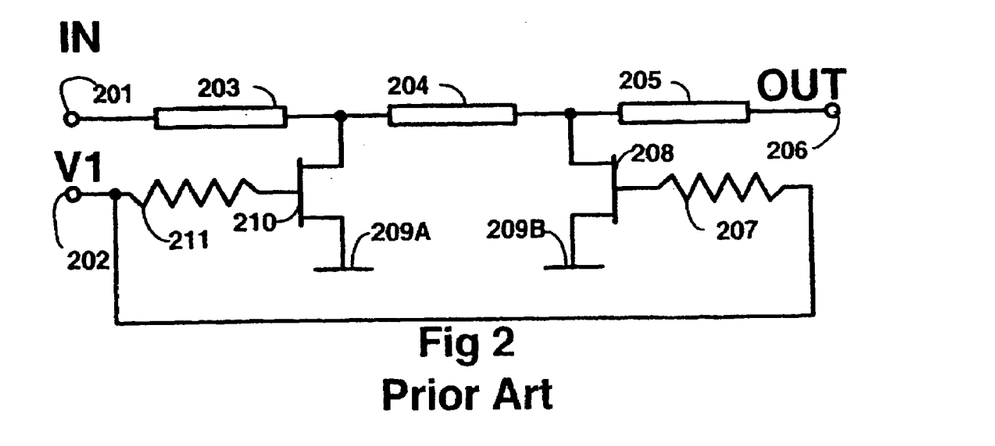
FIG. 2 shows a typical known attenuator implemented with FETs.

FIG. 2 depicts a prior-art single-chip FET-based circuit set up as a VVA 104. The VVA has an input (IN) 201 and an output (OUT) 206 and a RF line where the components are RF line elements 203, 204, and 205. The FET 210 is connected to the junction point of RF line elements 203 and 204 by its drain electrode, and FET 208 is connected to the junction point of RF line elements 204 and 205 by its drain electrode. A first end of resistor 207 is connected to the gate of FET 208. A first end of resistor 211 is connected to the gate of FET 210. Second ends of resistors 207 and 211 are connected to a control input (V1) 202 to produce gate control. The source electrodes of FETs 208 and 210 are connected to the ground potential via points 209B and 209A respectively.

The control voltage V1 of the VVA gate control 202 in FIG. 2 is used to control the drain-source resistance of the FETs functioning as VVRs, which controls the attenuation of the whole VVA, i.e. the ratio L of the input and output power. Resistors 211 and 207 are used to increase isolation between the RF line (elements 203, 204 and 205) and the gate control 202.

Figure 3A:
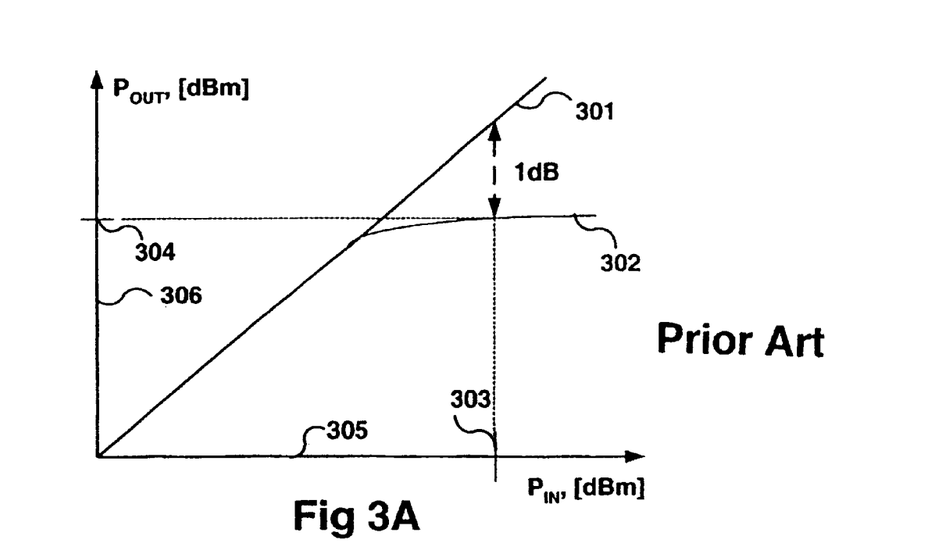
FIG. 3A illustrates the relation between the −1 dB compression point and interdependence of attenuator input power and output power.

FIG. 3A illustrates the interdependence of input power $P_{IN}$ and output power $P_{OUT}$ in a VVA. The interdependence is in accordance with the straight line 301 in an ideal case, but in practice the interdependence is not linear but may be in accordance with the curve 302. FIG. 3A shows points 303 and 304 for the input power axis $P_{IN}$ 305 and output power axis $P_{OUT}$ 306 where the deviation equals one decibel milliwats referred to one decibel milliwatt, −1 dBm.

One measure of attenuator linearity is the −1 dB compression point. One way of characterizing the attenuator and especially its linearity is to express the −1 dB attenuation compression point dependence as a function of the attenuation ratio L.

Figure 3B:
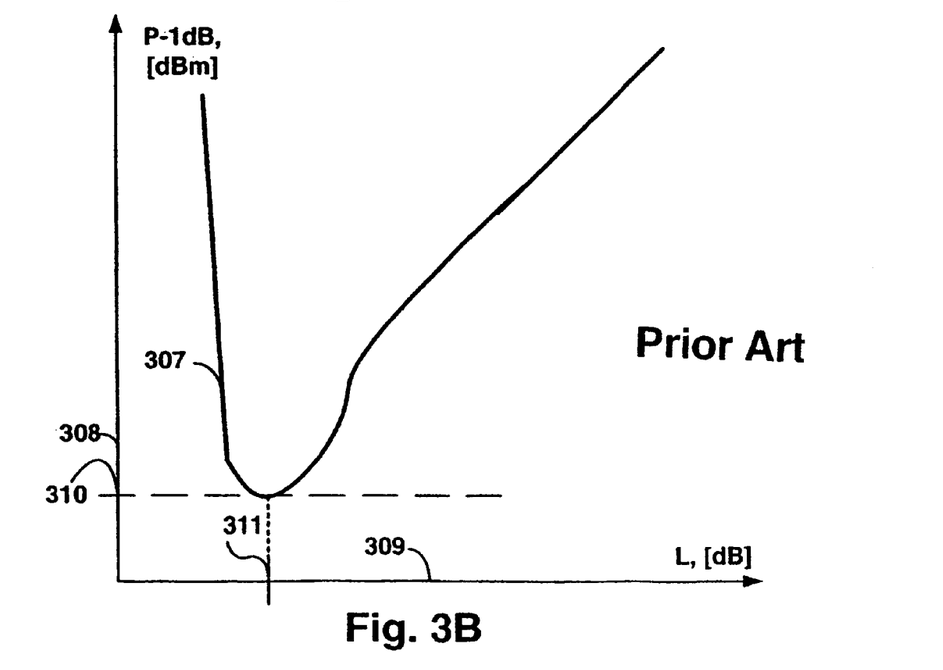
FIG. 3B shows for a circuit according to the prior art the interdependence of the −1 dB compression point as a function of attenuation.

To provide an example, FIG. 3B shows a curve 307 describing said dependence of an attenuator according to the prior art. The technical specifications of the system are selected according to the lowest linearity point of the attenuator, which in FIG. 3B is the minimum of curve 307, located at point 310 of the compression point axis 308, and at point 311 of the attenuation ratio axis 309. To improve the linearity it is possible to attempt to raise the minimum in the direction where the values of the compression point axis 310 get higher.

It is possible to attempt to solve the linearity problem by connecting FETs in series or using smaller FETs, but in both of these cases the minimum resistance of the VVR increases, which in practice will narrow down the dynamic range and usually causes additional losses. The linearity of a FET's drain-source resistance varies considerably as a function of the gate voltage. The linearity gets worse when adjusting the FET from the minimum resistance state towards higher resistance values whereby nonlinearity grows detrimental.

VVRs fabricated using typical monolithic GaAs processes are not linear enough, which in practice hampers their use in the VVAs of radio devices. It is known to make MESFETs (Metal Semiconductor Field Effect Transistors) and PHEMTs (Pseudomorphic High Electron Mobility Transistors) and VVRs that can be implemented using single FETs with a variable resistance and/or impedance. Their drawback is poor linearity. Therefore, the linearity of the VVA operation when implemented with a typical FET-based VVR, is rather poor as well.

Alpha Industries Inc. is known to have developed a process for fabricating triple-gate 0.25-μm MESFETs which are used e.g. in VVR applications as VVA elements (Alpha part #AV850M2-00). Linearity for said attenuator is fairly reasonable, the input compression point is in the order of +10 dBm in all attenuation states.

SUMMARY OF THE INVENTION

An object of the invention is to improve the VVR linearity and at the same time its usefulness in VVA, for instance.

The objects of the invention are achieved by making a VVA which has certain operating parameters and which comprises a plurality of sub-blocks with different VVRs having different electrical characteristics and of which at least one VVR is arranged so as to function within a certain range of the VVA operating parameters and in which range of the VVA operating parameters the electrical characteristics of said VVR are better than those of the other VVRs in the VVA.

A VVA and/or VVR according to the invention is intended to function in a transmitter or transceiver which advantageously is located in a network element operating in a cellular radio system or part of such system. Said network element may be e.g. a mobile station, some other portable terminal, base station, repeater station and/or some other fixed terminal.

A VVA according to the invention includes a VVR which has VVR blocks which can be controlled individually. We may also have a special case in which a VVR alone makes the VVA. A VVR according to the invention with individually-controllable VVR blocks can be fabricated e.g. on a single chip by making said VVR connecting VVR blocks, sub-VVRs, in parallel so that each of them can operate as a VVR as such, within the range of linear operation determined by its operating parameters. As a whole, said blocks make a VVA by means of which a desired characteristic, such as linearity and/or certain minimum resistance, can be realized over a large operating range as compared to an individual VVR, such as a VVR block, or compared to a VVA implemented with a single VVR. In accordance with the invention the VVR blocks employ semiconductor groups which may comprise semiconductors connected in series and/or in parallel, however such that each group has at least one semiconductor. The semiconductors may be FETs, PHEMTs, MESFETS and/or other similarly functioning semiconductors.

It should be noted, to avoid any ambiguity, that a conducting state of a semiconductor refers to a state in which said semiconductor substantially functions as a short-circuit between the input and output whereby its impedance is at its minimum, and also to a state in which there is between the input and output of said semiconductor an impedance not equal to a short-circuit but, however, lower than that of the material intended to serve as an insulator in the application. A non-conduction state refers to a state of said semiconductor where there is between the input and output of said semiconductor substantially an impedance which is in the order or that of the insulator intended to be used in the application. Thus in a single FET, for example, the input and output mentioned above may, in a VVR application, be the drain and source electrodes, the resistance between which is being controlled, and in a FET chain connected in series by its drain and source electrodes, where there are a plurality of FETs connected in series and constituting an entity used as a VVR, the input and output may be the drain and source electrodes at the ends of said FET chain so that e.g. the drain electrode at an end of said FET chain is the input, and the source electrode at an end of the FET chain is the output.

In said semiconductor groups of VR blocks there are e.g. different quantities of said semiconductors to create a certain electrical characteristic, such as impedance, for example, for each VVR block. Each VVR block has a certain sub-characteristic which is part of a certain electrical characteristic, such as linearity and/or minimum impedance, of a VVA.

Said sub-characteristic, such as a sub-impedance and/or sub-minimum resistance, of a said VVA, for example, can be achieved by grouping said semiconductors of the VVR blocks in said VVA in series and/or in parallel. However, each group must have at least one semiconductor, whereby it is obvious to a person skilled in the art that certain blocks in each group can be implemented, instead of series-connected components, using an individual component which has substantially similar electrical characteristics as a group of series- and/or parallel-connected components.

By setting suitable VVR blocks to operate within certain voltage ranges of linear response and by switching off others within the same voltage range in the nonlinear response area, it is produced an operating range with a wider voltage range, as there is always some part of the entity comprising VVR blocks functioning linearly enough in said range defined by the operating parameters. Then, as a whole, a VVR according to the invention operates over a large impedance and voltage range and guarantees an advantageous dynamic range. By connecting linearly operating VVR blocks in parallel it is additionally achieved a low minimum resistance for the VVR and VVA according to the invention.

For simplicity, the description to follow uses FETs as examples of semiconductors, but in practice other similarly functioning semiconductors can be substituted for the FETs, where applicable. The groups are switched on and/or off by the gate voltages of the FETs in the particular groups. A series connection of the FETs means here that e.g. the FETs' drain-source electrodes are connected in succession so that the source electrode of the first FET in a group is connected to the drain electrode of the second FET, and the source electrode of the latter is connected to the drain electrode of the next FET and so on. Let it be noted that a FET set up as a VVR has such an operating point that its drain and source electrodes can be connected in either way as input and output.

In an embodiment of the invention, automatic control is advantageously accomplished using a feedback so that the signal controlled by the VVR is used in generating directly and/or through an algorithm a control signal to the FET gates in a VVR block. For instance, through a cellular radio system it is possible to control a terminal having a VVR according to an embodiment of the invention. Control of a VVR and/or its block according to an embodiment of the invention can be based on transmission power or some other quantity dependent thereon to generate a control signal which can be defined in a certain manner over a certain time interval as a mean value of said quantity.

BRIEF DESCRIPTION OF THE DRAWINGS

Prior art was already discussed referring to FIGS. 1, 2, 3A and 3B, where.

The invention is next described more closely referring to advantageous embodiments presented as examples and to the accompanying drawings, where.

DETAILED DESCRIPTION OF THE PRESENTLY PREFERRED EMBODIMENTS

Above in the description of the prior art reference was made to FIGS. 1, 2, 3A and 3B, so the following description of the invention and its advantageous embodiments refers mainly to FIGS. 4A to 7.

Figure 4A:
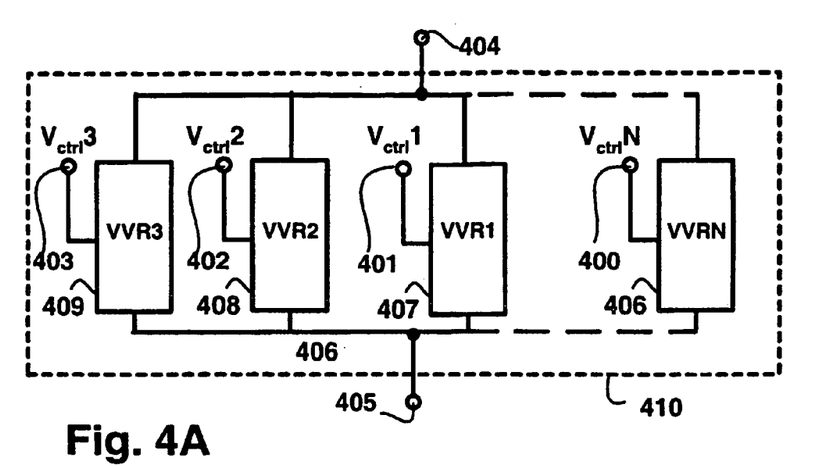
FIG. 4A shows a block diagram of a VVR according to an advantageous embodiment of the invention.

FIG. 4A shows a VVR 410 according to an advantageous embodiment of the invention where each of the VVR blocks 406, 407, 408, 409 is connected in parallel with the other VVR blocks. Parallel connection is realized by connecting blocks 406, 407, 408, 409 to nodes 404 and 405 between them. The function of the nodes 404 and 405 depends e.g. on the connection of the VVR 410 in relation to the signal transmission line. This is illustrated by examples depicted by FIGS. 5A, 5B and 5C and the descriptions thereof. FIG. 4A shows VVR blocks VVR1 407, VVR2 408, VVR3 409, and VVRN 406, all of which are independent VVRs having semiconductor-based inner structures of their own which will be described later on in conjunction with FIG. 4B.

Each of said VVR blocks has a control input of its own so that VVR1 407 has control input 401, VVR2 408 control input 402, VVR3 409 control input 403, and VVRN 406 has control input 400. In accordance with an advantageous embodiment of the invention, the control inputs are separate and independent of each other in order to produce an optimal attenuation range. Each VVR block 406, 407, 408, 409 is controlled by a separate signal, gate control signal, so that gate control signal $V_{ctrl}N$ controls via control input 400 the VVR block 406 to vary its impedance $Z_N$, gate control signal $V_{ctrl}1$ controls via control input 401 the VVR block 407 to vary its impedance $Z_1$, gate control signal $V_{ctrl}2$ controls via control input 402 the VVR block 408 to vary its impedance $Z_2$, and gate control signal $V_{ctrl}3$ controls via control input 403 the VVR block 409 to vary its impedance $Z_3$. The impedances are not shown in FIG. 4A but they are shown in FIG. 4B in conjunction with the example illustrating the detailed structure of the blocks.

Figure 4B:
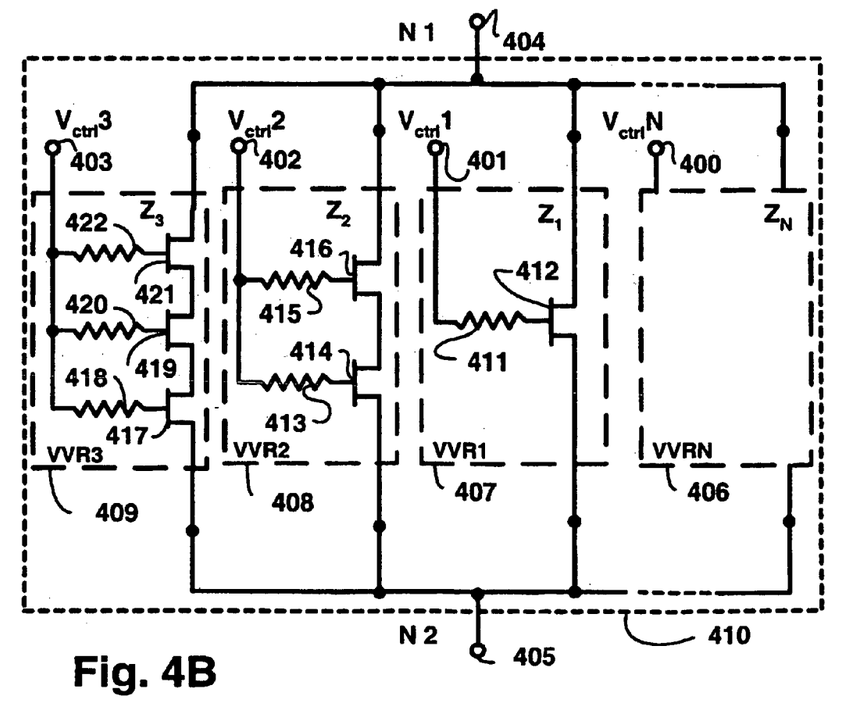
FIG. 4B shows the inner structure of the VVR blocks in a VVR according to FIG. 4A.

For illustrative reasons, FIGS. 4A and 4B show the blocks mentioned above, but there can also be more or fewer blocks than what is shown in the figures.

Said gate control signals can be used to switch the corresponding VVR block 406, 407, 408 and/or 409 not only into conducting state or effective insulator state, but also into intermediate states. Linear operation states of the blocks can be combined and permutated almost arbitrarily by changing the conductivity of the blocks by means of said gate control signals in a manner dependent on them. It is possible to control the blocks individually and/or in groups.

However, in advantageous embodiments of the invention the control is realized by driving said VVR blocks of the VVR 410 from the effective insulator state into conducting state one at a time. It is advantageous to drive the VVR blocks one at a time from the effective insulator state into conducting state. For example, when VVR 410 is in the maximum resistance state (whereby all its VVR blocks have the maximum resistance) and it is desirable to decrease the resistance of said VVR 410, the control procedure starts by controlling the VVR block of VVR 410 in which the linearity is the most advantageous over its whole control range. In practice, the minimum resistance of a linear VVR block is quite high, so when the resistance of said VVR block of said VVR 410 is set to the minimum and it is desirable to still decrease the resistance of the whole VVR, then the control for the next VVR block of said VVR 410 is started. The resistance of this VVR block, too, is driven from the maximum to minimum and only then it is started to control the resistance of the next block and so forth until all VVR blocks of said VVR 410 have been set to the minimum resistance at which point the resistance of said VVR 410 is at its minimum.

Similarly, if it is desirable to drive the resistance of VVR 410 higher than the minimum resistance, said blocks are controlled in an order which is reverse to that described above. In that case the last VVR block of VVR 410 to be controlled is the one which was controlled first in the case described above. Thus the linearity of the VVR (or VVA) behaves, to a certain accuracy, according to FIG. 4C (see reference designators 310 and 450 which represent certain attenuation stages in a prior-art arrangement (310) and in an arrangement according to an advantageous embodiment of the invention (450)).

Then, when a first VVR block is in the conducting state and it is found out that the control range of a control producing an operation defined as linear according to a certain criterion is running out of range, said first VVR block is driven non-conductive and at the same time a second VVR block is driven conductive whereby said second VVR block will have a more optimal control range than said first VVR block, and the control signal of the second block is used to control it.

Let it be noted that, functionally, the VVR and VVA are quite close to each other. However, VVA refers to a device or part thereof which contains a VVR. In a special case the VVA and VVR may be in a sense identical when the VVA is implemented with a VVR. Let it be emphasized at the same time that a VVR block refers particularly to a block in a VVR, which block functions as a VVR. A VVA according to an advantageous embodiment of the invention includes a VVR 410 consisting of blocks in which case a VVR block in the VVA refers solely to a VVR block 406, 407, 408, 409 in the VVR 410 according to advantageous embodiment of the invention or a corresponding block.

FIG. 4B shows a circuit arrangement of a block-based VVR 410 according to an advantageous embodiment of the invention, depicting, as an example, four VVR blocks 406, 407, 408 and 409 with block-specific sub-impedances $Z_N$, $Z_1$, $Z_2$, $Z_3$ between nodes 404 and 405. The VVR 410 in FIG. 4B is the same as that in FIG. 4A, but FIG. 4B shows the internal circuitry, based on FETs, of the blocks therein. In FIG. 4B, the VVR blocks are comprised of groups of FETs and their gate voltages for switching gate control from the control input of each VVR block to the gates of the FETs in each VVR block. It is also noted that in a VVR application, a FET is at such an operating point that, in a series connection, the drain and source electrodes can be coupled the other way, too, by interchanging the places of the drain and source electrodes e.g. in a VVR block of the circuit arrangement shown in FIG. 4B, so that the invention is not solely restricted to the circuit example described.

In VVR block 409 the FETs 417, 419, and 421 are connected in series by their drain and source electrodes. To the gate of each FET 417, 419, 421 of block 409 there is connected a second end of a resistor 418, 420, 422, one resistor per FET, and first ends of said resistors are connected to the same node 403, the gate control input, for supplying the gate control $V_{ctrl}3$ to block 409 the impedance of which between nodes 404 and 405 is $Z_3$.

In VVR block 408 the FETs 414 and 416 are connected in series by their drain and source electrodes. To the gate of each FET 414, 416 of block 408 there is connected a second end of a resistor 413, 415, one resistor per FET, and first ends of said resistors are connected to the same node 402, the gate control input, for supplying the gate control $V_{ctrl}2$ to block 408 the impedance of which between nodes 404 and 405 is $Z_2$.

In VVR block 407 there is one FET 412 the gate resistor 411 of which is connected to node 401, the gate control input, for providing the gate control $V_{ctrl}1$ to block 407 the impedance of which between nodes 404 and 405 is $Z_1$. The drain and source electrodes are connected to nodes N1 404 and N2 405.

In each VVR block 408, 409 there is a series-connected FET 416, 421 the drain electrode of which is at the farthest end of the series-connected FET chain. The drain electrode of this FET 416, 421 is connected to node 404. In each VVR block 408, 409 there is also a FET 413, 417 the source electrode of which is at the farthest end of the series-connected FET chain. The source electrode of this FET 413, 417 is connected to node 405.

Block 406, too, is one of the parallel-connected blocks between nodes 404 and 405, but no internal circuit structure is shown for it. Analogous to VVR blocks 408 and 409, also VVR block 406 includes a semiconductor at a second end of the semiconductor chain comprised of series-connected semiconductors (not shown) like FET 416 in block 408 whereby an electrode analogous to the drain electrode of said semiconductor is connected to node 404. Block 406 further includes a second semiconductor at a first end of the semiconductor chain comprised of series-connected semiconductors (not shown) like FET 413 in block 408 whereby an electrode analogous to the source electrode of said semiconductor is connected to node 405. The semiconductor chain itself is not shown for VVR block 406. Gate control $V_{ctrl}N$ for the FETs of block 406 is provided via node 400 and, thus, through the gate resistor of each FET to the FET in question, which is not shown in block 406, the impedance of which between nodes 404 and 405 is $Z_N$. Let it be also noted that the types of said electrodes analogous to the drain and source electrodes depend on the semiconductor used in block 406. In bipolar transistors, for example, said electrodes analogous to the drain and source electrodes can be the collector and emitter. It is obvious to a person skilled in the art, based on the type of the semiconductor used, which way a semiconductor other than a FET shall be coupled to the series-connected semiconductor chain in the VVR.

The example circuit arrangement shown in FIG. 4A or 4B may also include other parallel-connected blocks not depicted in the drawing. For example, in block 406 there are N FETs, where N is an integer. These FETs are connected like those in block 408, in series, through drain and source electrodes in order to achieve an electrical characteristic in the block.

A FET can also be replaced by some other semiconductor which is arranged to operate similarly. In that case the semiconductor functions linearly over a certain voltage range, say, over the gate control voltage range, and non-linearly over some other corresponding voltage range, in accordance with a certain definition of non-linearity. The number of VVR blocks in the drawing could be considerably higher and/or smaller, almost arbitrarily, but advantageously however, about in the order of that shown in the example.

FETs in the VVR blocks can be partly or entirely replaced by some other similar component such as e.g. bipolar junction transistors (BJT), heterojunction bipolar transistors (HBT), pseudomorphic high electron mobility transistors (PHMET) and metal-semiconductor field effect transistors (MESFET). A person skilled in the art can easily choose on the basis of the invention a component having electrical characteristics such that it can be suitably inserted to serve as a component in circuit 406. Also these components may be mounted in a monolithic fashion.

VVR blocks according to the invention can be combined in various combinations of series and parallel connection to produce an advantageous minimum resistance for a certain VVA characteristic and/or use.

The FETs in each VVR block in FIG. 4B can be controlled discretely by switching on and off and adjusting the control voltage to it. The control voltage produces a gate voltage at the gate of each FET. Thus a certain VVR block impedance and its control range are achieved over a certain control range of the control voltage. By changing the values of the gate voltage it is thus possible to change the drain-source resistance of individual FETs in a group. With suitable quantities and resistances of the FETs it is possible to linearly cover a very large area of attenuation stages by a VVR as compared to conventional technology.

An individual FET can be controlled with different gate voltages which may also be constant voltages. A constant voltage means a voltage that stays constant to a certain accuracy, excluding the rise or fall time related to the setting thereof to a certain value. The gate voltage need not be a DC voltage, not even regularly changing.

Controlling may be active so that the gate voltage is allowed to vary in a controlled manner over a certain control range. Controlling may also mean stabilizing the gate voltage in order to remove certain ripple, in which case it is called regulation.

Figure 4C:
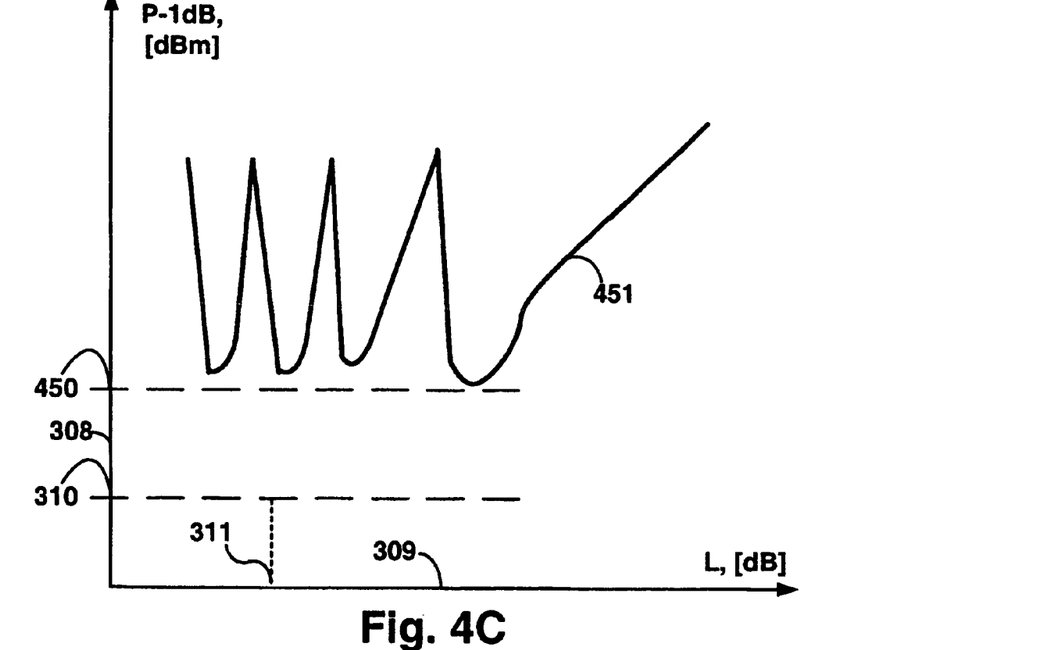
FIG. 4C illustrates for a circuit according to FIG. 4A the interdependence of the −1 dB compression point as a function of attenuation in relation to the solution according to the prior art.

FIG. 4C shows a curve 451 representing the dependence of the −1 dB compression point $P_{-1\ dB}$ on the attenuation ratio L in a VVR according to an embodiment of the invention. Since the attenuator system usually has to be set up according to the poorest linearity point of the attenuator, the minimum point 450 on curve 451 is clearly higher than the corresponding point 310 according to the prior art, whereby the linearity also is better. The vertical and horizontal axes 308 and 309 in the coordinate system of FIG. 4C do not have absolute scales for measured values.

Figure 5A:
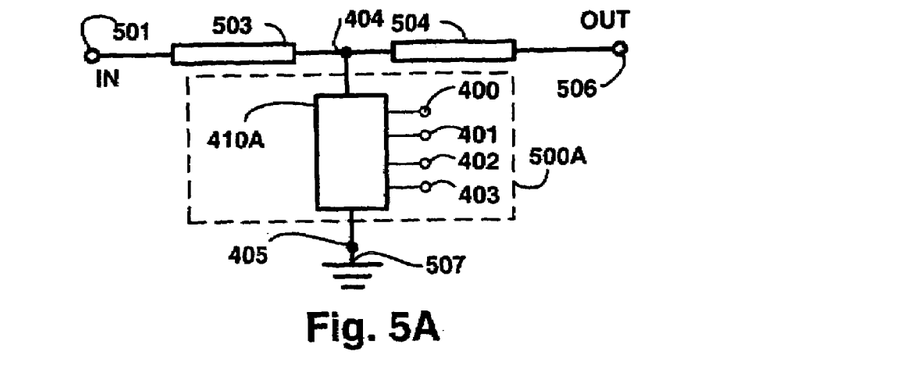
FIG. 5A shows an implementation of a VVA according to an embodiment of the invention using a VVR according to FIG. 4A.
Figure 5B:
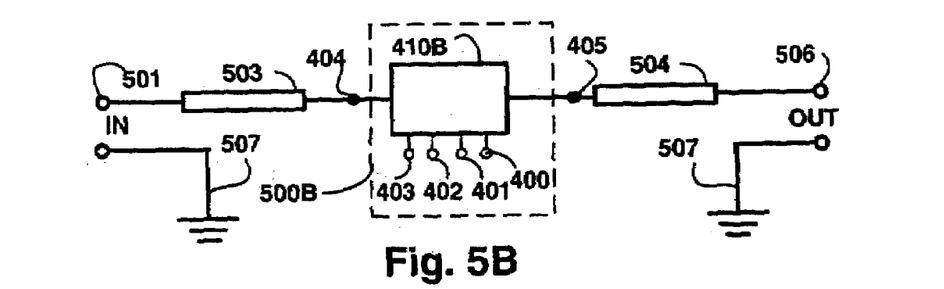
FIG. 5B shows an implementation of a VVA according to a second embodiment of the invention using a VVR according to FIG. 4A.
Figure 5C:
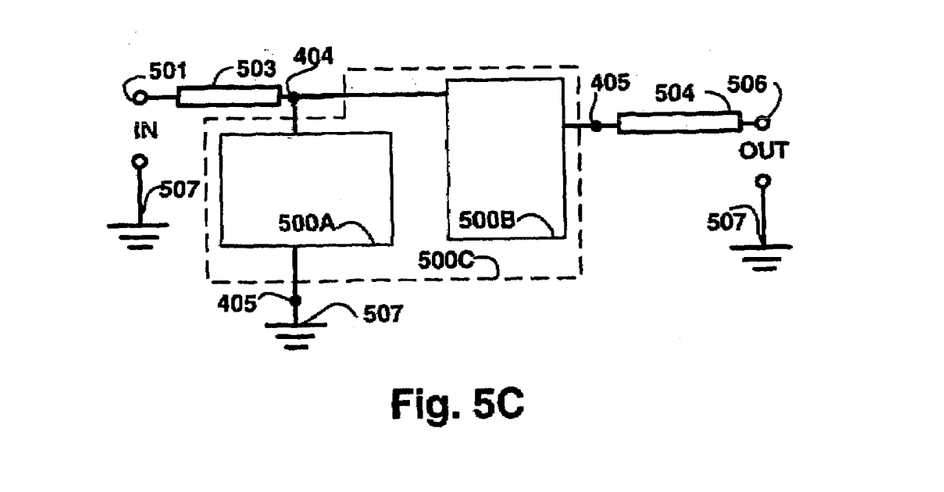
FIG. 5C shows an implementation of a VVA according to a third embodiment of the invention using a VVR according to FIG. 4A.

FIGS. 5A, 5B and 5C show examples of how the VVR 410 of FIG. 4A can be connected to a signal transmission line to function as part of a VVA. VVR 410 and VVRs 410A and 410B have like structures as such, but their electrical characteristics may be different and, on the other hand, they may differ in their control signal selections for which reason they are distinguished by letters A and B. The control signal control inputs 400, 401, 402 and 403 are included in FIGS. 5A and 5B but for simplicity, they are left out of FIG. 5C. However, in FIGS. 5A, 5B and 5C the control signal inputs correspond to the inputs in FIGS. 4A and 4B, also for VVRs 410A and 410B.

FIG. 5A shows a VVA 500A and signal transmission line elements 503 and 504 which are connected together through node 404. At VVA 500A the signal to be attenuated is brought to input IN 501 from where it is taken to node 404 via the signal transmission line 503. Attenuated signal comes out at output OUT 506 where it arrives via the signal transmission line 504 from node 404. The VVR 410A is connected between nodes 404 and 405. In addition, node 405 is connected to signal ground 507 whereby VVR 410A of FIG. 5A is connected to the signal transmission line in parallel with the output of the signal stage preceding the VVR 410A.

In FIG. 5B the VVA 500B also includes signal transmission line elements 503 and 504 but the VVR 410B is connected between these 503, 504 in series so that node 404 is connected to a second end of the signal transmission line 503 and node 405 is connected to a first end of the signal transmission line element 504. The first end of the signal transmission line element 503 is connected to the input IN 501, and the second end of the signal transmission line element 504 is connected to the output OUT 506. Said signal transmission line elements 503, 504 and VVR 410B are mutually in series on the propagation path of the signal phase whereby the signal is connected to the VVA 500B to its input 501 and whereby the signal is relative to the signal ground 507.

In FIG. 5C the VVA 500C comprises a VVA 500A and VVA 500B. Combining the VVAs shown in FIGS. 5A, 5B and 5C it is possible to build different attenuators such as e.g. pi and/or T attenuators in order to produce a combination having an advantageous impedance, for example.

Figure 6:
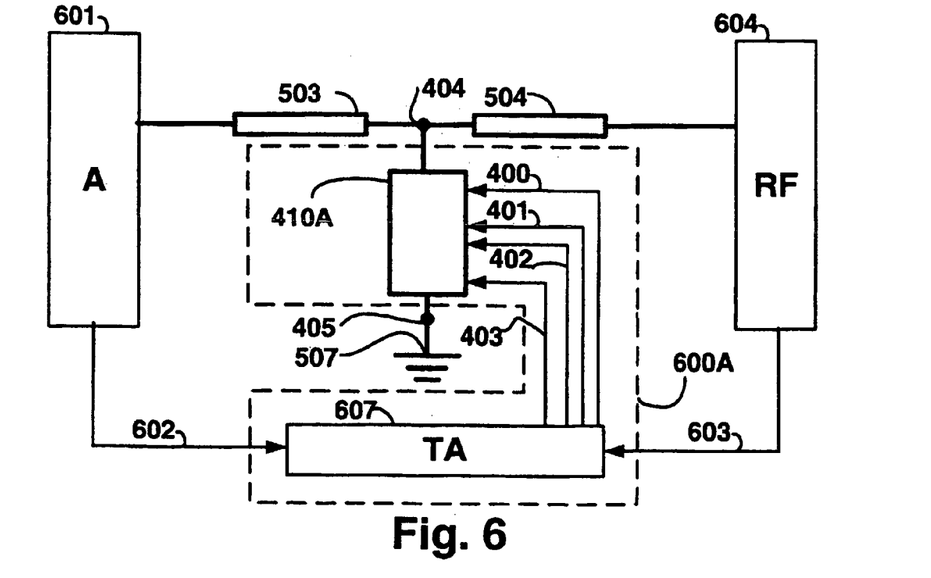
FIG. 6 shows an example of the generation of control signals for the VVR of FIG. 4A using feedback.

FIG. 6 shows an example to illustrate a control feedback arrangement for a VVR 410A according to an embodiment of the invention in conjunction with a VVA 600A. VVA 600A is otherwise similar to VVA 500A but it additionally includes feedback means TA 607. In the circuit arrangement of FIG. 6 the signal comes from an amplifier, block A 601, via a signal transmission line 503 to VVA 600A, containing a VVR 410A and, feeding the latter, control inputs 400, 401, 402 and 403 for which a control signal is generated by the feedback means TA 607. This receives a control from e.g. a RF block 604 and/or block A 601. In addition to those two, the control may be implemented as a certain combination of said controls. Block A may further include other elements of a cellular radio device.

In FIG. 6, the VVA 600A includes e.g. a VVR 410A which is connected between nodes 404 and 405 so that to node 404 there is also connected the second end of the signal transmission line 503 and the first end of the signal transmission line 504. The first end of the signal transmission line 503 is connected to block A 601 at its output. The second end of the signal transmission line 504 is connected to the RF block 604 at its input. The VVR 410A is connected through node 405 to signal ground 507. By means of a control connected e.g. from the feedback means TA 607 to each control input 400, 401, 402 and 403 of the VVR 410A in the VVA 600A it is possible to achieve dynamic control for the corresponding VVR block of the VVR. Control for said control inputs can be produced using a control signal available from the feedback means TA 607 so that through the feedback means TA 607 a certain control signal value is selected for a desired control input to achieve a certain attenuation. According to the feedback principle it is then possible to monitor the differential changes in attenuation using e.g. suitable means in block 604, and generate a signal for the control of the feedback means TA 607. It is also possible to take a control signal available from block A 601, for example, and to use it to control the feedback means TA 607. FIG. 6 further shows the supply line 602 to the feedback means TA 607 from block A 601, and supply line 603 from the RF block 604. It is possible to have a similar feedback in conjunction with the VVA 500B (FIG. 5B) through its 500B control inputs.

The impedance $Z_N$, $Z_1$, $Z_2$, $Z_3$ of each sub-VVR 406, 407, 408, 409 can be varied in response to a control voltage in order to maintain a desired attenuation. The feedback means TA 607 may also comprise a distributed arrangement so that the sensors for generating the feedback signal, for example, are placed to monitor a part in the device such that a signal obtained from that part is to be used for controlling the VVA.

A VVR according to an embodiment of the invention can also be used e.g. in the VVA of a mobile station. Then it is also possible to control a VVR block in said VVA and, thus, the transmission power of the mobile station through a radio signal conveyed through a base station of a cellular radio network, for example.

Figure 7:
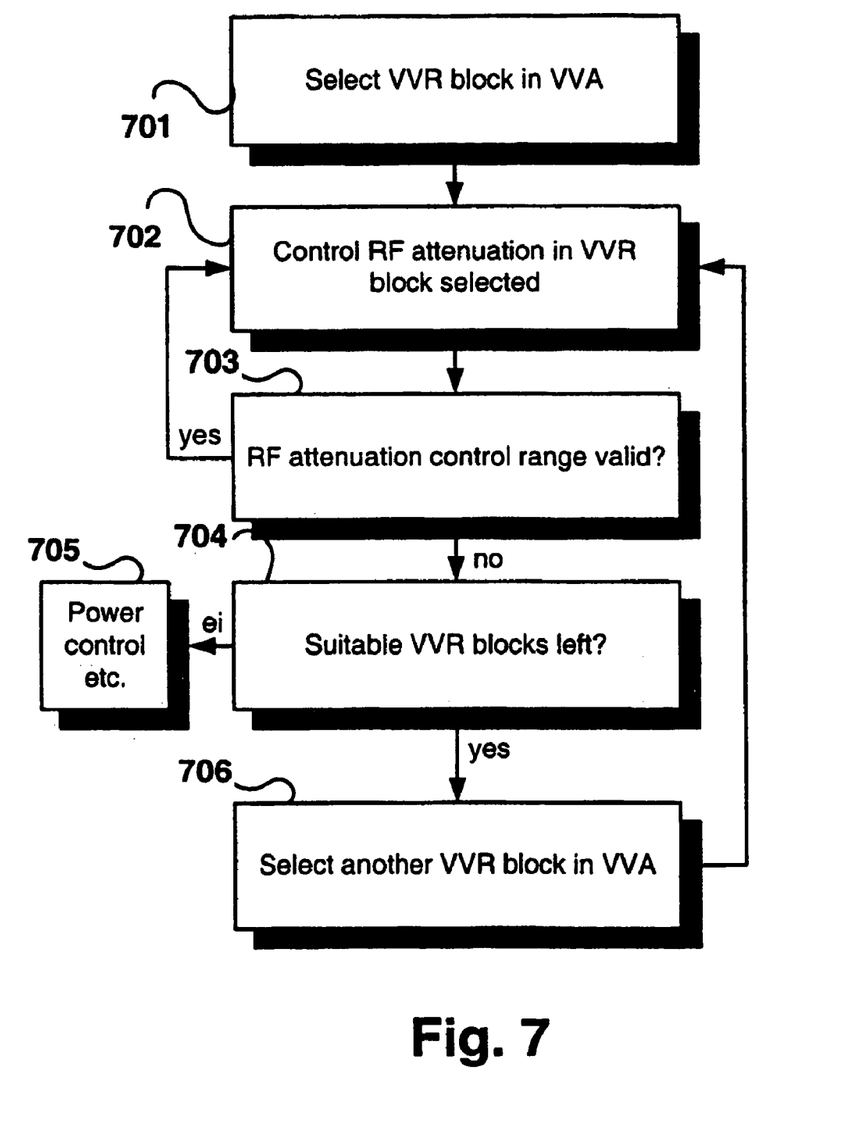
FIG. 7 illustrates a diagram for a method according to an embodiment of the invention for controlling a VVA.

FIG. 7 illustrates a method according to an embodiment of the invention for controlling a VVA 500A, 500B. In a VVA 500A, 500B, comprising a VVR 410A, 410B which consists of sub-VVRs 406, 407, 408, 409, there is selected 701 a sub-VVR, VVR block 406, 407, 408, 409 the impedance $Z_N$, $Z_1$, $Z_2$, $Z_3$ of which is to be changed in order to produce a certain attenuation. The attenuation of said VVR block is controlled 702 e.g. on the basis of a signal obtained from feedback means (in the example of FIG. 6, TA 607). Furthermore, it is checked whether 703 RF attenuation is within suitable control range. If it is, control continues at step 702, and if not, it is checked 704 whether suitable VVR blocks are available. If suitable VVR blocks are available, it is selected 706 in the VVA a suitable second block which has a more advantageous control range than the current one, and if no suitable VVR blocks are available, power is adjusted 705 suitable for the VVA range. The method is also applicable for controlling a feedback-based VVA 600A.

FIG. 7 does not show all the details of block control variations that fall within the scope of the invention, but to a person skilled in the art it is obvious on the basis of the invention how to generate control signals for each sub-block in an advantageous manner. Neither does the diagram of FIG. 7 show the handling routines for possible errors. Thus the detailed functioning of an error routine depends on the operation of the device in which the VVR and/or VVA is located and the purpose of an error routine is to optimize the operation of the device despite the error.

It is possible that in an embodiment of the invention the linearity of a VVA can be dynamically corrected in certain operating parameter ranges. Such a situation may arise e.g. in conjunction with certain transmission peak power, during which a certain VVR block functions more optimally than the VVR used during average transmission power would function during said peak power. In such a case it is possible to use feedback and, therein, a control signal proportional to a certain value obtained from a VVR, which signal in an advantageous case may e.g. depend on a certain mean transmission power. Then it is switched non-conductive those blocks the operation of which is inadvantageously non-linear from the VVR operation standpoint as compared to some other block. In theory, it would also be possible to substantially simultaneously drive some VVR blocks in conducting state to compensate for each others' characteristics deviating from the ideal operation using individual control signals which are independent of each other in some suitable manner and which can be connected to control inputs.

On the basis of the examples described for the embodiments of the invention it is obvious to a person skilled in the art that a VVA and/or VVR according to the invention can also be used in other applications taking into account the special characteristics of the invention.

What is claimed is:

1. A voltage variable resistor (VVR) for attenuating a signal, having an input port and an output port for an element of the signal to be attenuated comprising:
    a certain variable overall impedance, arranged between said input and output ports, consisting of at least a first sub-impedance of a first VVR block, arranged to be controllable by a signal, and a second sub-impedance of a second VVR block, arranged to be controllable by another signal;
    said first VVR block has a first control input, and said second VVR block has a second control input for coupling control signals to control each of said first and second impedances by means of which at least one of said first and second sub-impedance can be controlled independently;
    wherein at least one of said first and second TVR blocks comprise semiconductors connected in series for implementing a corresponding one of said first and second sub-impedances and the overall impedance is arranged so as to be variable substantially linearly over a certain value range of a control signal;
    wherein said second sub-impedance has at least one more series connected semiconductor than said first sub-impedance.

2. The VVR of claim 1, wherein a value of a quantity, which depends on said overall impedance, is substantially linearly variable over a certain value range of a control signal.

3. The VVR of claim 1, wherein a VVR block between its input and output ports can be connected in series with a signal transmission line through the input and output ports of said VVR.

4. The VVR of claim 1, wherein at least one VVR block coupled between the input and output ports of the VVR can be connected between a signal transmission line and a node at a reference voltage through the input and output ports of said VVR.

5. The VVR of claim 1, wherein said semiconductor is a field effect transistor.

6. The VVR of claim 1, wherein said semiconductor is a metal-semiconductor field effect transistor.

7. The VVR of claim 1, wherein said semiconductor is a pseudomorphic high electron mobility transistor.

8. The VVR of claim 1, wherein the first VVR block has a minimum impedance that is different than the minimum impedance of the second VVR block.

9. The VVR of claim 1, wherein in a VVR block, semiconductors are connected in series in order to achieve a certain sub-impedance.

10. The VVR of claim 1, wherein in a VVR block a semiconductor is provided in order to achieve a certain minimum impedance.

11. The VVR of claim 1, wherein signal-controllable VVR blocks of the VVR are connected in parallel.

12. A voltage variable attenuator (VVA), wherein the VVA includes the VVR of claim 1.

13. The VVA of claim 12, wherein the VVA has a monolithic circuit structure and contains on a same monolith other components applicable in a radio device.

14. The VVA of claim 12, further comprising:
    feedback means functionally connected to the VVA for generating a control signal that is applied to at least one control input of the VVA.

15. A radio system terminal including a voltage variable resistor (VVR) for attenuating a signal, and having an input port and an output port for an element of the signal to be attenuated, comprising:
    a certain variable overall impedance, arranged between said input and output ports, consisting of at least a first sub-impedance of a first VVR block, controllable by a signal, and a second sub-impedance of a second VVR block, controllable by another signal;
    said first VVR block has a first control input, and said second VVR block has a second control input for coupling independent control signals to each of said first and second sub-impedances so that said first and second sub-impedances can be controlled independently of each other;
    wherein at least one of said first and second VVR blocks comprise semiconductors connected in series for implementing a corresponding one of said first and second sub-impedances and the overall impedance is arranged so as to be variable substantially linearly over a certain value range of a control signal;
    wherein said second sub-impedance has at least one more series connected semiconductor than said first sub-impedance.

16. A method for controlling a voltage variable resistor (VVR) comprised of VVR blocks by varying an impedance between conducting and non-conduction states by means of a signal which is connectable to a control input thereof, comprising the steps of:
    selecting in the VVR of a voltage attenuator (VVA) a variable first VVR block with a first sub-impedance to be controlled;
    controlling the first sub-impedance of the selected variable first VVR block within advantageous control range limits of the variable first VVR;
    monitoring the control;
    changing, at an end of the advantageous control range of the selected variable first VVR block, the selected variable first VVR block into a second variable VVR block with a second sub-impedance, the control range of which is more advantageous than that of said variable first VVR block so that an overall impedance of said VVR comprised of VVR blocks can be varied substantially linearly over a certain value range of said signal which is connectable to the control input;
    wherein at least one of said variable first and second VVR blocks comprise semiconductors connected in series for implementing a corresponding one of said first and second sub-impedances to be controlled for varying the overall impedance substantially linearly over a certain value range of a control signal;
    wherein said second sub-impedance has at least one more series connected semiconductor than said first sub-impedance.

17. The method of claim 16, further comprising the step of:
    keeping a response of the VVR linear through dynamic feedback.

18. The method of claim 16, wherein feedback means are used to produce control signals for the VVR blocks of the VVR.

19. The method of claim 18, wherein the feedback means are controlled at least partly based on a control signal dependable on a quantity influencing a transmission power of a radio device.

20. The method of claim 19, wherein said control signal is radioed in a cellular radio system from a radio signal source thereof to be used in a radio device for controlling a VVR therein.

* * * * *

UNITED STATES PATENT AND TRADEMARK OFFICE
CERTIFICATE OF CORRECTION

PATENT NO. : 7,157,988 B2  Page 1 of 1
APPLICATION NO. : 10/485977
DATED : January 2, 2007
INVENTOR(S) : Petri Nyberg It is certified that error appears in the above-identified patent and that said Letters Patent is hereby corrected as shown below:

In Claim 1:  Column 11, line 23, delete "TVR" and insert --VVR--.

Signed and Sealed this

First Day of May, 2007

JON W. DUDAS
*Director of the United States Patent and Trademark Office*